United States Patent
Georgescu

(10) Patent No.: US 6,989,562 B2
(45) Date of Patent: Jan. 24, 2006

(54) NON-VOLATILE MEMORY INTEGRATED CIRCUIT

(75) Inventor: Sorin S. Georgescu, San Jose, CA (US)

(73) Assignee: Catalyst Semiconductor, Inc., Sunnyvale, CA (US)

( * ) Notice: Subject to any disclaimer, the term of this patent is extended or adjusted under 35 U.S.C. 154(b) by 115 days.

(21) Appl. No.: 10/600,125

(22) Filed: Jun. 20, 2003

(65) Prior Publication Data
US 2004/0197993 A1     Oct. 7, 2004

Related U.S. Application Data

(60) Provisional application No. 60/460,799, filed on Apr. 4, 2003.

(51) Int. Cl.
*H01L 29/788* (2006.01)
(52) U.S. Cl. .................. 257/315; 257/315; 257/314
(58) Field of Classification Search .............. 257/315, 257/314, 329, 295, 296; 365/185
See application file for complete search history.

(56) References Cited

U.S. PATENT DOCUMENTS 5,327,378 A * 7/1994 Kazerounian .......... 365/185.16
5,793,079 A    8/1998 Georgescu et al.
6,009,014 A   12/1999 Hollmer et al.
6,108,229 A    8/2000 Shau
6,480,419 B2 11/2002 Lee
6,687,148 B2  2/2004 Shau

* cited by examiner

Primary Examiner—David Nelms
Assistant Examiner—Thinh T Nguyen
(74) Attorney, Agent, or Firm—Bever, Hoffman & Harms, LLP; E. Eric Hoffman

(57) ABSTRACT

A nonvolatile memory integrated circuit arrayed in rows and columns is disclosed. Parallel lines of implant N-type regions are formed in a P-well of a semiconductor substrate, with lines of oxide material isolating each pair of the lines. Columns of memory cells straddle respective pairs of the implant region lines, with one line of the pair forming the source region and one line of the pair forming the drain region of each memory cell of the column. Each memory cell has a floating polysilicon storage gate. One of plural wordlines overlies each row of the memory cells. The portion of the wordline overlying each memory cells forms the control gate of the memory cell. Programming and erase operations occur by Fowler-Nordheim tunneling of electrons through a tunnel oxide layer between the floating gate and the source of the cell.

10 Claims, 8 Drawing Sheets

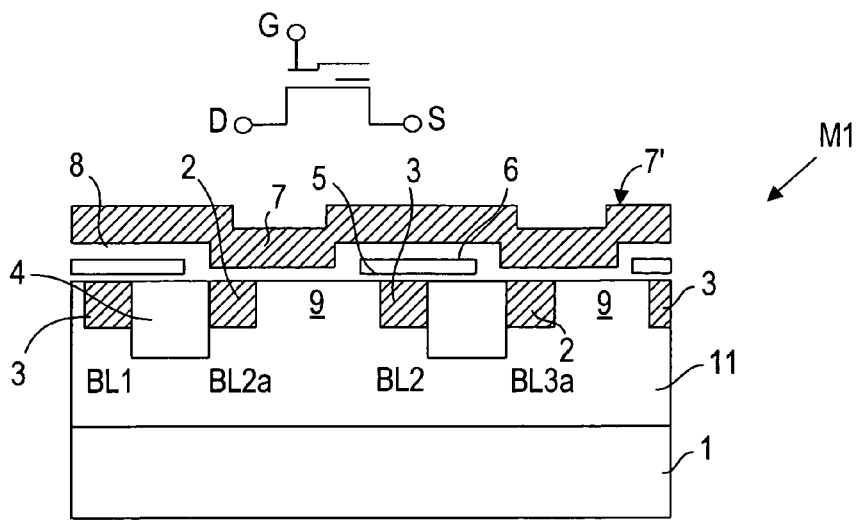
Fig. 1
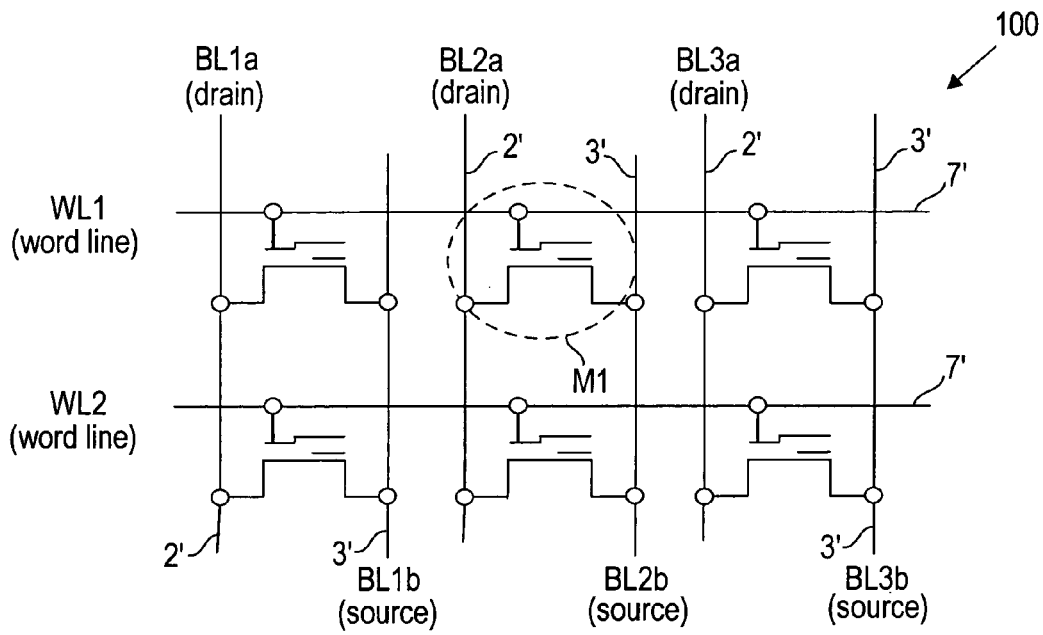
Fig. 2
Table 1
| | BL1a | BL1b | BL2a | BL2b | BL3a | BL3b | WL1 | WL2 |
|---|---|---|---|---|---|---|---|---|
| Erase | F | F | F | F | F | F | -Vpp | 0 |
| Write | Vppx | F | 0 | F | Vppx | F | Vpp | <Vppx |
| Read | Vr | 0 | Vr | 0 | Vr | 0 | ~Vcc | 0 |
Note: Vppx < Vpp:2, Vr~1V
Fig. 2a

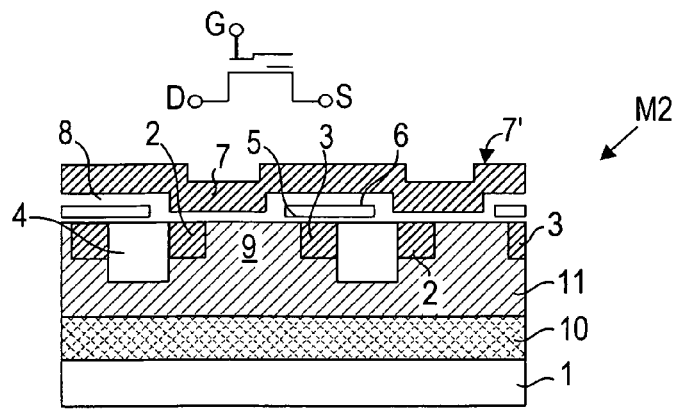
Fig. 6
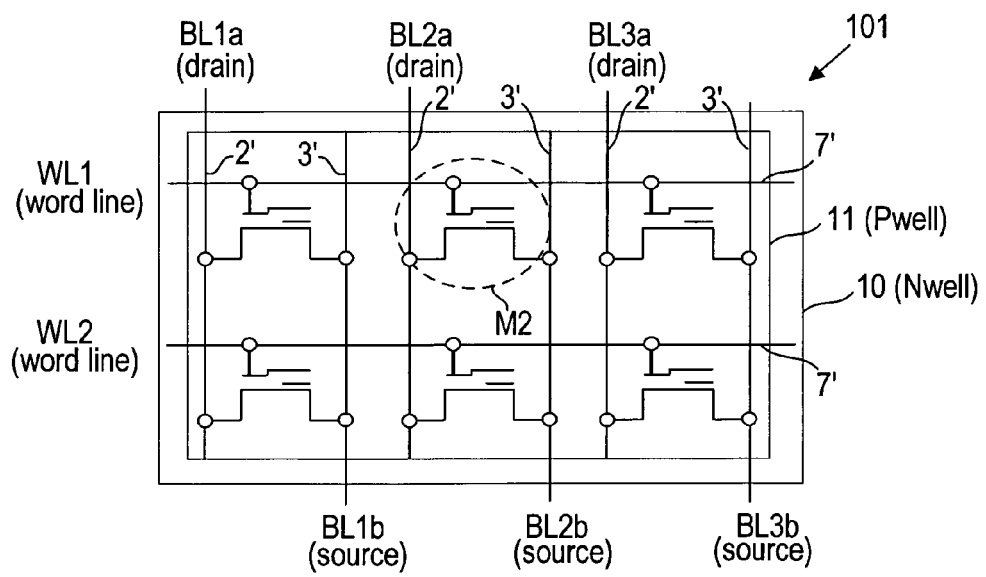
Fig. 7
Table 2
| | BL1a | BL1b | BL2a | BL2b | BL3a | BL3b | WL1 | WL2 | Pwell | Nwell |
|---|---|---|---|---|---|---|---|---|---|---|
| Erase | F | F | F | F | F | F | 0 | Vpp | Vpp | Vpp |
| Write | Vppx | F | 0 | F | Vppx | F | Vpp | <Vppx | 0 | 0 |
| Read | Vr | 0 | Vr | 0 | Vr | 0 | ~Vcc | 0 | 0 | 0 |
Note: Vppx <= Vpp:2, Vr~1V
Fig. 7a

NON-VOLATILE MEMORY INTEGRATED CIRCUIT

CROSS REFERENCE TO RELATED APPLICATION

The present application claims priority to U.S. Provisional Application Ser. No. 60/460,799, filed on Apr. 4, 2003, which is incorporated herein by reference in its entirety.

BACKGROUND OF THE INVENTION a. Technical Field

The present invention is in the field of non-volatile memory integrated circuits.

b. Description of the Related Art

Two well known types of non-volatile memory integrated circuits are: (1) electrically-erasable electrically-programmable read only memory (EEPROM) integrated circuits; and (2) electrically flash reprogrammable read only memory (flash) integrated circuits.

A typical EEPROM includes an array of memory cells, with each memory cell consisting of two MOSFET transistors: a select transistor and a storage transistor. The select transistor controls access to the storage transistor. The storage transistor includes a source region, a drain region, and a channel region between the source and drain regions. Two gates overlie the channel region: (1) a lowermost, electrically-isolated, floating gate; and (2) an overlying, control gate. A thin oxide layer, called tunnel oxide, is between the floating gate and the channel region. Electrons move back and forth through the tunnel oxide by Fowler-Nordheim tunneling, leaving the floating gate with either a net positive or a net negative charge. When a net positive charge is on the floating gate, the storage transistor conducts when a specified read voltages is applied to the control gate. When a net negative charge is on the floating gate, the storage transistor does not conduct upon application of the read voltage. The conductive state is interpreted as a logical one, and the nonconductive state is interpreted as a logical zero.

EEPROMs have attributes that make them better for some applications than others, due to the fact that EEPROMs have separate select and storage transistors. For instance, EEPROMs are robust and reliable. Moreover, because of the separate select transistor, EEPROM cells may be erased at the byte and page level. EEPROM cells also are efficient users of current, because the programming current is very low with Fowler-Nordheim tunneling. On the other hand, EEPROMs are relatively low speed, and each EEPROM cell occupies a relatively large area. The large area results from the presence of the two transistors, and the need for each memory cell to have contacts for connecting both to a bitline and a wordline.

A flash memory, by contrast to an EEPROM, is comprised of single transistor memory cells. The flash memory cell includes a lowermost, polysilicon floating gate, and an overlying polysilicon control gate. A thin tunnel oxide layer separates the floating gate from the substrate. Both the programming and erase operations occur through Fowler-Nordheim tunneling of electrons through the tunnel oxide between the floating gate and the semiconductor substrate.

Like EEPROMs, flash memory has features that make it better for some applications than others. For instance, flash memory cells occupy much less area than EEPROM cells, and are faster. However, flash memories cannot be erased in as selective a manner as an EEPROM. Flash memory is erased in blocks. Further, in a flash memory, because there is not a separate select transistor, an operation directed at one cell can easily disturb the stored charge on the floating gate of nearby cells. Because of this risk of disturbance, flash memories must include circuit to verify the contents of the memory. This verify circuitry consumes current, which can affect the operation time of battery-operated devices. In addition, while flash cells are much smaller than EEPROM cells, there are contacts at each memory cell to a bitline and a wordline, and these contacts consume valuable chip area.

Clearly, it would be desirable to have a non-volatile memory that combines the reliability and low current operation of an EEPROM, while at the same time having the small size and speed of a flash memory.

SUMMARY OF THE INVENTION

The present invention includes a non-volatile memory, a memory cell for the non-volatile memory, a method of operating the non-volatile memory, and a method of making the non-volatile memory, amongst other aspects. As exemplified by the disclosed embodiments, the invention substantially reduces the size of the memory cell relative to EEPROMs, and provides a simple and reliable memory solution for embedded applications and serial flash applications, among other possibilities.

In one embodiment, the non-volatile memory includes rows and columns of non-volatile memory cells formed in a first region of a first conductivity type in a semiconductor substrate. Shallow implant regions of a second conductivity type are provided in the first region, in the form parallel pairs of lines. One of a plurality of columns of the memory cells overlaps each pair of implant region lines, which function as local bitlines. One of the diffusion region lines provides respective source regions for all of the memory cells of the respective column, and the other of the diffusion region lines of the pair provides respective drain regions for all of the memory cells of the column. Respective subportions of the first region between the diffusion region lines of the pair (i.e., between the source and drain regions of the respective memory cells) form the channel region of the memory cell.

Plural isolation region lines, such as field oxide lines or shallow trench isolation lines, are formed in the first region and extend parallel to the diffusion region lines, with one of the respective isolation region lines separating adjacent pairs of the diffusion region lines. Accordingly, the columns of memory cells are isolated from each other by an intervening one of the isolation region lines.

A thin tunnel oxide layer is formed on the source side each of the memory cells, over and in contact with the source region of the memory cell. At each of the memory cells, an electrically-isolated rectangle of polysilicon located over and in contact with the tunnel oxide layer serves as a floating gate, which stores positive or negative charge, depending on whether the memory cell is storing a logical one or zero.

A second layer of polysilicon is formed into parallel wordlines that each extend perpendicularly to the diffusion region lines. Each of the polysilicon wordlines overlies a respective one of the rows of memory cells. In particular, each polysilicon wordline overlies the floating gate, the source region, the drain region, and the channel region of each of the plural memory cells of the particular row of memory cells, as well as the isolation region line that is between adjacent memory cells of the row. At each of the memory cells of the row, a respective, integral subportion of the polysilicon wordline functions as the control gate of the memory cell. An intervening layer of dielectric material separates the polysilicon wordline from the underlying floating gate, the channel region, and the drain region of the memory cell.

The exemplary non-volatile memory cells disclosed herein have the reliability and low current consumption of an EEPROM cell, while also having the small area and speed of flash memory. Each memory cell includes a select transistor in series with a storage cell, as in an EEPROM, but there is only a single source region, drain region, and channel region, as in a flash memory cell. The number of contacts for the memory array are drastically reduced in comparison to both EEPROM and flash memory cells. In addition, interaction between adjacent memory cells, in the wordline direction, is suppressed by using separate local bitlines for the cell source and drain regions, and by providing an isolation region between the adjacent cells. Further, the memory cell has an integrated select gate that avoids the cumbersome verify cycles needed by standard flash memory.

These and other aspects of the present invention will become apparent in view of the detailed description and the accompanying drawings of the exemplary embodiments.

BRIEF DESCRIPTION OF THE DRAWINGS

FIG. 1 is a cross-sectional side view of a first embodiment of a non-volatile memory cell, and portions of two adjacent memory cells, taken along a wordline of a memory array, in accordance with the present invention.

FIG. 2 is a schematic diagram of an array of the non-volatile memory cells of FIG. 1.

FIG. 2a is a table of parameter values for erase, write, and read operations of the non-volatile memory cells of FIG. 2.

FIG. 6 is a cross-sectional side view of a second embodiment of a non-volatile memory cell, and portions of two adjacent memory cells, taken along a wordline of a memory array, in accordance with the present invention.

FIG. 7 is a schematic diagram of an array of the non-volatile memory cells of FIG. 6.

FIG. 7a is a table of parameter values for erase, write, and read operations of the non-volatile memory cells of FIG. 7.

In the drawings of the exemplary embodiments, like features are labeled with the same reference numbers, and redundant discussion of the like-numbered features typically is omitted for the sake of brevity.

DETAILED DESCRIPTION

Figure 3:
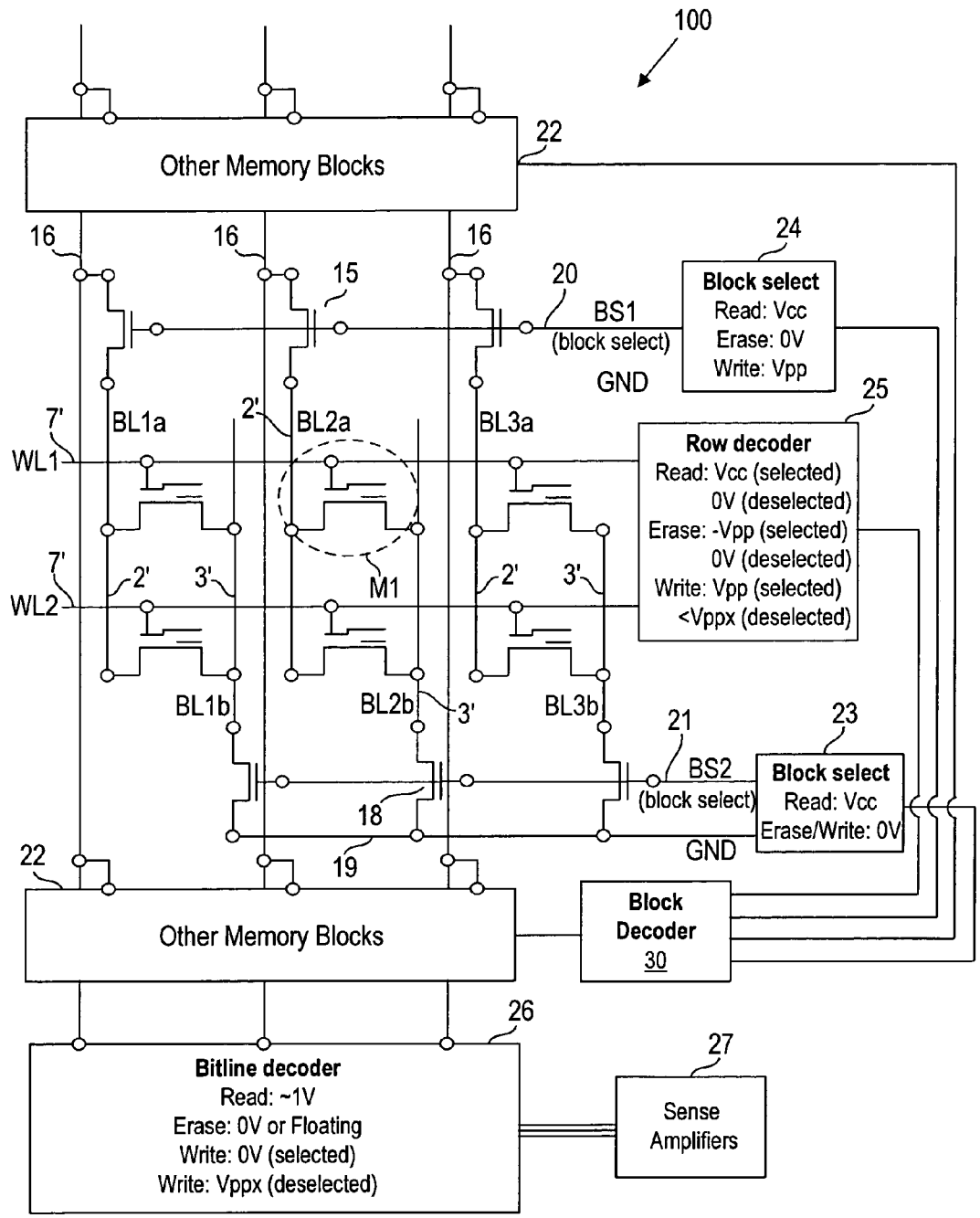
FIG. 3 is a schematic diagram of a non-volatile memory array showing an interconnection of plural blocks of the memory cells of FIGS. 1 and 2, and parameter values for operation of the memory array.

In FIGS. 1–3, a first embodiment of a non-volatile memory array 100 is presented. Memory array 100 includes a plurality of memory cells M1 arranged in rows and columns. FIG. 1 provides a schematic diagram of one memory cell M1, and a cross-sectional side view of the memory cell M1 and portions of two identical, adjacent memory cells in the same row. The cross-sectional side view is taken through a center of the memory cell M1 along the polysilicon wordline 7' overlying the row of memory cells. Each memory cell M1 is a distinct, split gate transistor.

Figure 4A:
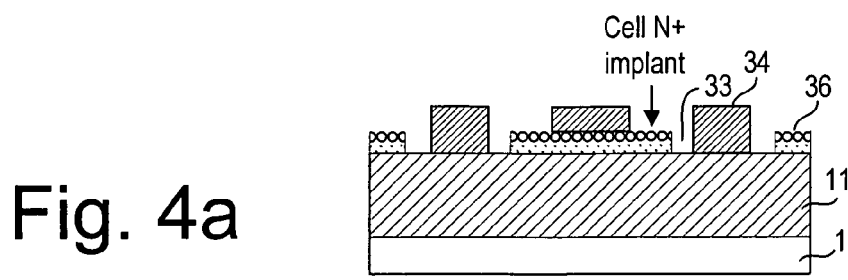
FIGS. 4a–4e are cross-sectional side views of stages in a first process for making memory cells, in accordance with the present invention.
Figure 5A:
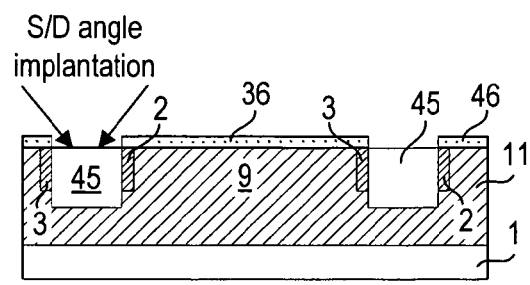
FIGS. 5a–5d are cross-sectional side views of stages in a second process for making memory cells, in accordance with the present invention.
Figure 5B:
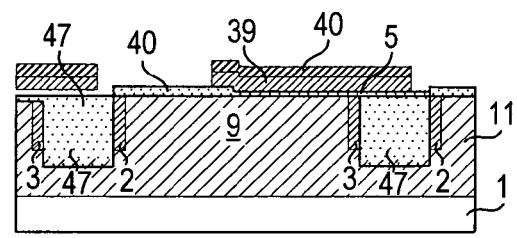
Figure 5C:
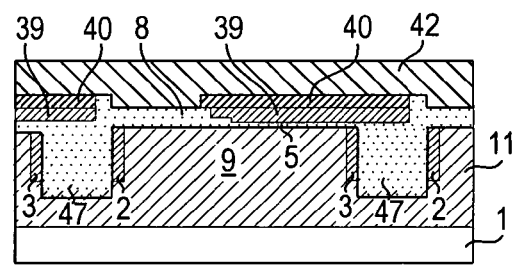

The rows and columns (FIGS. 2, 3) of memory cells M1 are formed in a deeply-diffused P-well 11 (FIGS. 4a, 5a) in a P-type semiconductor substrate 1. Heavily-doped, N-type, shallow diffusion regions are provided in P-well 11 in the form parallel pairs of lines 2', 3'. A column of the memory cells M1 overlaps each pair of implant region lines 2', 3', which serve as local bitlines. A subportion of one of the diffusion region lines (denoted 2') of the pair is the drain region 2 of the memory cell M1, and an adjacent subportion of the other diffusion region line (denoted 3') of the pair serves as the source region 3 of the memory cell M1. That is, each source diffusion region line 3' includes the source region 3 for all of the memory cells M1 of one of the columns of memory cells, and the associated, adjacent drain diffusion region line 2' provides the drain region 2 for all of the memory cells of the column of memory cells. A subportion of P-well 11, denoted channel region 9, is between the source region 3 and the drain region 2 of each memory cells. (The term "channel region" is used to refer to a subportion of the P-well 11 between the source and drain regions 3, 2 where a channel would form if the transistor turned on. The channel region is present even when the transistor is not on.)

Shallow trench isolation (STI) regions 4 (FIGS. 1, 5a) are formed in the P-well 11 in the form of lines that extend parallel to the drain and source diffusion region lines 2', 3'. One of the STI region lines 4 separates each of the adjacent pairs of the drain and source diffusion region lines 2', 3', so that memory cells in the same row are electrically isolated from each other. In an alternative embodiment, the STI region lines are replaced by field oxide region lines.

A thin, tunnel oxide layer 5 is provided on the source side of each of the memory cells. The tunnel oxide layer is over, and in contact with, the source region 3 and the a source-side subportion of the P-well 11 surface over channel region 9. The tunnel oxide layer does not overlie the drain region 2 of the memory cell, but rather is separated from the drain region by a region of a thicker dielectric layer 8, as is discussed below.

At each of the memory cells M1, an electrically isolated rectangle of a first polysilicon layer overlies, and is in contact with, the tunnel oxide layer 5 over the source region 3 and the source-side subportion of the P-well 11 surface covered by tunnel oxide layer 5. This rectangle of polysilicon is the floating gate 6 of the memory cell. A second layer of polysilicon is formed into parallel wordlines 7' that each extend perpendicular to the diffusion region lines 2', 3'. Each of the plural polysilicon wordlines 7' overlies one of the rows of memory cells M1. The wordline 7' extends integrally over the source region 3, floating gate 6, channel region 9, and drain region 2 of every memory cell of the row and over the isolation regions 4 that are between adjacent memory cells of the row.

At each memory cell M1, the subportion of the polysilicon wordline 7' overlying the memory cell M1 functions as the control gate 7 of the memory cell M1. An intervening, relatively-thick dielectric layer 8 (e.g., oxide) separates the polysilicon wordline 7' from the underlying floating gate 6, from the drain-side portion of the P-well 11 surface uncovered by the floating gate 6, and from drain region 2 of the memory cell M1. Dielectric layer 8 is much thicker than tunnel oxide layer 5, and separates the floating gate 6 from the drain region 2. The floating gate 6, tunnel oxide layer 5, and the dielectric layer 8 are between the control gate 7 and the underlying source region 3.

The non-volatile memory cell M1 of FIG. 1 thus has an electrically isolated floating gate 6 that is over and in contact with a tunnel oxide layer 5 that itself is over and in contact with the source region 3. The floating gate 6 is on the source-side of the memory cell, and terminates over the channel region 9. Hence, the floating gate 6 does not extending over the drain-side of the channel region or over the drain region 2. The control gate 7, on the other hand, extends over the entire channel region 9 and over the source and drain regions. A dielectric layer 8 separates the control gate from the P-well 11 surface, and thus functions as a gate dielectric. Portions of dielectric layer 8 also isolate and separate the control gate 7 from the floating gate 6, and the floating gate 6 from the drain region 2. The arrangement of the floating gate 6 and control gate 7 is as a split gate transistor.

A schematic diagram of a portion of the memory array 100 is shown in FIG. 2. For simplicity, only three columns and two rows of memory cells M1 are shown. The basic operation of this small memory array is shown in Table 1 (FIG. 2a) as an illustration of the operation of a larger memory array comprised of any number of rows and columns of memory cells M1. A typical memory array will have a plurality of memory cells in each of a plurality of rows and columns.

Referring to FIG. 2 and Table 1, an erase operation erases all of the memory cells of a selected row. During the erase, the wordline 7' (denoted WL1) overlying the selected row, which includes the circled memory cell M1, is biased to a negative high voltage, −Vpp, for a selected period of time, e.g., on the order of a few milliseconds. The deselected wordline 7' (WL2) over of the deselected row of memory cells is grounded. At the same time, for each of the columns, the drain region lines 2' (BL1a, BL2a, BL3a) and the source region lines 3' (BL1b, BL2b, BL3b) are floating. Accordingly, the floating gates 6 of every memory cell in the selected row (WL1) is biased, by capacitive coupling, to negative voltages such that electrons on the respective floating gate 6 pass through the tunnel oxide layer 5 to the P-well 11 by Fowler-Nordheim tunneling. As a result, the floating gates 6 of the memory cells of the selected row all become positively charged. The erased state corresponds to the conductive state of the memory cell M1. The −Vpp voltage can be in the range −12V to −20V depending, for instance, on the thickness of tunnel oxide layer 5, floating gate coupling, and other memory cell construction details.

Practitioners will appreciate that one or more rows of the memory cells can be erased in a single erase operation, depending on how many wordlines 7' are biased to the negative high voltage, −Vpp.

During a write operation for the selected (i.e., circled) memory cell M1 of FIG. 2, the wordline 7' (i.e., the control gate 7) for the selected memory cell M1 (and the other memory cells of the same row) is biased at positive high voltage, Vpp. Meanwhile, the drain region line 2' (BL2a) for the selected memory cell M1 (and the other memory cells of the same column) is grounded (0 V). In addition, the source region lines 3' (BL1b, BL2b, BL3b) for the selected column and the other columns are allowed to float. The application of Vpp to the selected wordline 7' (i.e., to the control gate 7 of the selected cell) biases the floating gate 6 of the selected memory cell M1, by capacitive coupling, to a positive voltage. As a result, at the selected memory cell M1, electrons pass from channel region 9 through the tunnel oxide layer 5 to floating gate 6 by Fowler-Nordheim tunneling.

Note that, during the write operation, for the cells of the selected row, the source region line 3' is floating and will take the same potential as the drain region line 2' because the selected memory cell is turned on during programming (the control gate voltage is very high). The absence of a voltage bias between the drain and source regions of the selected memory cell during programming helps to avoid junction breakdown and to avoid the emission of hot carriers. Hot carriers are known to cause oxide and interface deterioration in non-volatile memories Accordingly, during the write operation, the floating gate 6 of the selected memory cell M1 develops a net negative charge. This state, called the programmed state, corresponds to the non-conductive state (logical zero) of the selected memory cell M1. The positive Vpp voltage can be in the range 12V to 20V, similarly as in the erase phase.

During the write operation, deselection of the memory cells on the same row as the selected memory cell M1 is accomplished by counterbiasing the drain region lines 2' (BL1a, BL3a) of the deselected columns of memory cells to a lower positive voltage, Vppx. (The source region lines 3' (BL2b, BL3b) are allowed to float.) The value of Vppx may be in the range of 3V to 7V, and generally depends on the separation window between the erased and programmed state. Typically, Vppx is less than or equal to half of Vpp. The application of Vpp to the selected wordline 7', together with the application of Vppx on the drain region lines 2' of the deselected columns, will bias the respective tunnel oxide regions to a voltage equal or less than the difference between Vpp and Vppx, which bias is too small to cause any significant Fowler-Nordheim programming. Accordingly, the floating gates 6 of the deselected memory cells in the selected row will not be affected.

During the write operation, there is a disturb path for the memory cells on the deselected rows 7' (WL2), because the source region lines 3' of the deselected columns are biased to Vppx. Recall that the source region lines 3' float, and take the same potential as their counterpart drain region line 2'. This disturb risk can be completely avoided by biasing the deselected wordline 7' (WL2) overlying the deselected rows of memory cells to a voltage equal to or less than Vppx. The application of a voltage <Vppx on deselected wordline will bias the respective tunnel oxide regions to a voltage too small to cause any significant change in the floating gate charge.

During a read operation for the selected (i.e., circled) memory cell M1 of FIG. 2, all of the source region lines 3' (BL1b, BL2b, BL3b) are connected to ground (0 V) and all of the drain region lines 2' (BL1a, BL2a, BL3a) are biased to a low positive voltage, Vr, which may be ~1V. Meanwhile, the selected wordline 7' (WL1) overlying the selected memory cell M1 (and the other memory cells of the same row) is biased to a low positive voltage, normally equal to the supply voltage, Vcc. The deselected wordlines 7' (WL2) are grounded, in order to block current to the deselected rows of memory cells. A sense amplifier (not shown) detects whether the selected memory cell M1 turns on in response to the application of Vcc to the wordline 7' (i.e., the control gate 7) of the selected memory cell. If the selected memory cell M1 of FIG. 2 is in an erased state (i.e., logical one, with a net positive charge on floating gate 6), then the application of Vcc to the selected wordline 7' will turn on the selected memory cell transistor. The conductive state is interpreted as a logical one. On the other hand, if the selected memory cell M1 is in a programmed state (i.e., logical zero, with a net negative charge on floating gate 6), then the application of Vcc to wordline 7', i.e., to the control gate 7, of the selected memory cell M1 will not turn on the transistor. The non-conductive state is interpreted as a logical zero.

The read and write operations access independently any column in a memory block. Consequently, any number of columns (e.g., one or more) can be programmed and read simultaneously.

FIG. 3 shows an architecture of a non-volatile memory 100, in accordance with one embodiment of the present invention. Parameters for the erase, write, and read phases also are shown in FIG. 3.

Memory 100 is organized in blocks 22, with each block 22 consisting of any number of rows and columns of memory cells M1. The number of rows of memory cells M1 is normally a power of 2 (16, 32, 64, etc). Each row of memory cells M1 in the block 22 has a corresponding, overlying wordline 7'. All of the respective wordlines 7' of a block 22 are coupled to a row decoder 25 that selects the wordline bias during the erase, write and read operations. Each column of the block 22 contains a selected number of memory cells that each overlap the same pair of drain and source region lines 2', 3'. One end of each drain region line 2' is coupled through a pass transistor 15 to a main bitline 16 (e.g., a metal bitline). All pass transistors 15 are controlled by a first block select signal (BS1) that is produced by a block select circuit 24. The first block select signal (BS1) is provided to the respective gates of all of the transistors 15 via block select line 20. One end of each source region line 3' is coupled through a pass transistor 18 to the ground line 19. All pass transistors 18 are controlled by a second block select signal (BS2) that is produced by a block select circuit 23. The second block select signal (BS2) is provided to the respective gates of all of the pass transistors 18 via block select line 21. The main bitlines 16 are biased through the bitline decoder circuit 26. During the read phase, a bitline decoder 26 connects selected bitlines 16 to the sense amplifier 27, which determines whether the particular memory cell coupled to the main bitline is conductive (logical one) or nonconductive (logical zero). Normally, the sense amplifier 27 processes eight bits at a time, although there is no limitation to the number of bits that can be processed (read).

Selection of a subset (e.g., one) of the blocks 22 from among the entire set of blocks 22 during erase, write, and read operations is performed by a block decoder circuit 30 that is coupled to each of the blocks 22. The block decoder circuit 30 may be coupled to control the block select circuit 24, row decoder 25, and block select 23 of each block 22.

During an erase operation, row decoder 25 selects the particular row(s) of the selected block 22 that are to be erased, and provides a high negative voltage (−Vpp) to the overlying wordline 7' (WL1). Meanwhile, block select circuitry 24 couples block select line 20 to ground (BS1=0 V), which grounds the gates of pass transistors 15, ensuring that pass transistors 15 remain off. Block select circuitry 23 couples the block select line 21 to ground (BS2=0 V), ensuring that pass transistors 18 remain off. Accordingly, the drain region lines 2' and the source region lines 3' of the selected block 22 float. Bitline decoder 26 may either couple the main bitlines 16 to ground (0 V), or allow the main bitlines 16 to float.

The application of −Vpp to the selected wordline 7' (WL1) overlying the selected row of memory cells M1 causes electrons on the floating gate 6 of every memory cell of the row to pass through the tunnel oxide 5 to the underlying P-well 11, resulting in a net positive charge on the floating gate 6. Accordingly, all memory cells in the selected row(s) are erased. Row decoder 25 may deselect other rows of memory cells by applying a ground voltage (0 V) to the wordline 7' (WL2) overlying each of the deselected rows of memory cells of the block 22.

In a write operation, row decoder 25 applies a high positive voltage (Vpp) to the selected wordline 7' (WL1) overlying the selected (i.e., circled) memory cell M1. Row decoder 25 also applies the lower positive voltage Vppx (or smaller) to the deselected wordlines 7' (WL2). Meanwhile, bitline decoder 26 causes the main bitline 16 for the column that includes the selected cell M1 to be grounded (0 V), and the main bitlines 16 for the deselected columns to be set to Vppx. In addition, block select circuitry 24 provides a first block select signal (BS1) equal to Vpp to the gates of pass transistors 15 on block select line 20. Accordingly, pass transistors 15 turn on, thereby causing the drain region line 2' (denoted BL2a) for the selected memory cell M1 (and the other memory cells of the same column) to be at ground (0 V), and the drain region lines 2' (denoted BL1a, BL3a) for the deselected columns to be at Vppx. In addition, block select circuit 23 couples block select line 21 to ground (0 V), so that pass transistors 18 remain off. Accordingly, source region lines 3' are floating, and will take the same potential as the associated drain region line 2'.

The application of Vpp to the selected wordline 7' (WL1) overlying the selected memory cell M1 causes electrons to pass from the channel region 9 to the floating gate 6 through the tunnel oxide 5, leaving the floating gate 6 with a net negative charge. This state, called the programmed state, corresponds to the non-conductive state of the memory cell M1. The floating gates 6 of the deselected memory cells in the same row (WL1) as the target cell do not accumulate such a negative charge, i.e., are unaffected, because of the application of Vppx to their respective drain region line 2'. The floating gates 6 of the memory cells in the deselected rows are unaffected, because of the application of Vppx to the deselected wordlines 7' (WL2) by row decoder 25.

During a read operation, row decoder 25 applies a positive voltage (on the order of Vcc) to the selected wordline 7' (WL1) overlying the selected (i.e., circled) memory cell M1. Row decoder 25 also coupled the deselected wordlines 7' (WL2) to ground, ensuring that no current passes through the memory cells of the deselected rows. Meanwhile, bitline decoder 26 causes a selected number of the main bitlines 16 to be set to a low positive voltage Vr, e.g., 1 V, with Vr being less than Vcc. Block select circuit 24 provides a first block select signal (BS1) of Vcc on block select line 20 to the gates of pass transistors 15, which causes pass transistors 15 turn on, thereby setting the drain region lines 2' (BL1a, BL2a, BL3a) to Vr. Block select circuit 23 provides a second block select signal (BS2) of Vcc on block select line 21 to the gates of pass transistors 18, which turns on pass transistors 18. Accordingly, pass transistors 18 couple source region lines 3' (BL1b, BL2b, BL3b) to ground line 19. As a result, the selected memory cell M1, which has its drain region line 2' biased to Vr, its source region line 3' grounded, and its overlying wordline 7' (WL1) at Vcc, will conduct if its floating gate 6 is storing a positive charge (i.e., erased state), and will not conduct if its floating gate 6 is storing a negative charge (i.e., programmed state). Bitline decoder 26 couples the main bitline 16 of the column including the selected memory cell M1 to the sense amplifier 27, which determines whether the selected memory cell M1 is conductive or not conductive. Deselected memory cells in other rows do not turn on, because the deselected wordlines 7' (WL2) are set to ground by row decoder 25.

In view of the above discussion of FIGS. 1–3, practitioners will appreciate various features of non-volatile memory 100 and non-volatile memory cell M1. For example, non-volatile memory cell M1 includes a select transistor comprising a source region 3, drain region 2, channel region 9, and control gate 7. This select transistor controls access to the floating gate 6 of the memory cell, similar to an EEPROM. Yet, the memory cell does not have the two separate transistors of an EEPROM. Accordingly, the memory cell M1 can be much smaller than an EEPROM cell. For instance, the size of a memory cell is sometimes reported in terms of the feature size squared, or $F^2$. A memory cell in accordance with the present invention may have an area of 8–10 $F^2$, which is comparable to a FLOTOX-style flash memory cell. By comparison, a standard EEPROM may have an area of 40–50 $F^2$.

Reduced size is also made possible by elimination of certain contacts at each of the memory cells. In particular, unlike conventional EEPROMs or flash memory cells, there is no need to have a separate contact to the bitline and wordline at each memory cell. Rather, for non-volatile memory 100, one contact is provided at the end of the drain region line 2, and one contact is provided to the source region line 3, for an entire column of memory cells. Further, the need for contact between particular memory cells and the wordline 7' is accomplished by using an subportion of the overlying wordline 7' as the control gate 7 of all of the respective memory cells of the row.

Cell size reduction in comparison to an EEPROM is also achieved by the fact that only low voltages (0 V or Vppx) are placed on the bit lines 16 (and hence on the drain region lines 2' and source region lines 3'). Vppx is, in some embodiments, 3 to 7 Volts, which is less than half of Vpp.

Further, reliable operation is obtained relative to conventional flash memories in that, during a write operation, there no bias between the drain and the source regions of the memory cell. This avoids junction breakdown and the generation of hot carriers.

Further, the risk of disturbing some memory cells while accessing another memory cell, as is common with flash memories, is eliminated, or at least largely eliminated. Such reliability is obtained, for instance, by: (1) the provision of dielectric isolation regions 4 between adjacent pairs of source and drain region lines 3', 2'; (2) the provision of a select transistor to control access to the floating gate 6; and (3) the ability to bias deselected wordlines 7' to Vppx. The use of low voltage on the columns (e.g., 0 V or Vppx on the drain and source region lines 2', 3') practically eliminates the bitline disturb.

Two exemplary processes for making the memory cells M1 of the non-volatile memory of FIGS. 1–5 are described below. A first process implementation is based on LOCOS field oxidation. Referring to FIGS. 4a–4e, the field oxide 36 substitutes for the STI regions 4 of FIG. 1. Such a process may be used, for instance, where feature sizes are 0.35 micron and above. The second implementation, which is shown in FIGS. 5a–5d, uses shallow trench isolation (STI), as depicted in FIG. 1. This second embodiment lends itself to processes having feature sizes smaller than 0.35 microns.

Other methods for making the memory cells described above may present themselves to practitioners in view of the disclosure herein and known methods in the art.

Figure 4B:

In the first implementation, the processing starts with a P-type silicon wafer 1 (FIG. 4a), into which a P-well 11 is implanted and diffused. The memory cells are formed in P-well 11. A pad oxide/thin nitride layer 36 is deposited on top of P-well 11. The active mask is then realized by etching openings 33 in the pad oxide/nitride layer 36. An N+ implant is performed through photoresist mask 34. A small area self-aligned to the edge of the field mask is implanted, followed by a diffusion step. Accordingly, the parallel pairs of drain and source region lines 2', 3' (FIGS. 2, 3) are formed in P-well 11. A LOCOS field oxidation step follows the formation of the drain and source diffusion region lines 2', 3'. The LOCOS field oxidation step produces parallel lines of field oxide 36 in the P-well 11. Each line of field oxide 36 is between adjacent pairs of the drain and source region lines 2', 3', and is parallel to the drain and source region lines 2', 3'. At particular memory cells, the drain and source regions 2, 3 are realized in facing bird's beak areas of adjacent of field oxide lines 36, as shown in FIG. 4b. Channel region 9 is between the drain and source regions 2, 3. Each of the field oxide lines 36 isolates the source regions 3 of the memory cells of one column from the drain regions 2 of an adjacent column of the memory cells.

Next, a thin layer of tunnel oxide 5 is grown over channel region 9. The tunnel oxide thickness is on the order of 7–11 nm, which is the practical range for non-volatile memories. The tunnel oxide area can extend over the whole wafer (outside field oxide) or it may be restricted to the memory area only. The choice is dependent on the particular process implementation in adding the low voltage module.

Figure 4C:
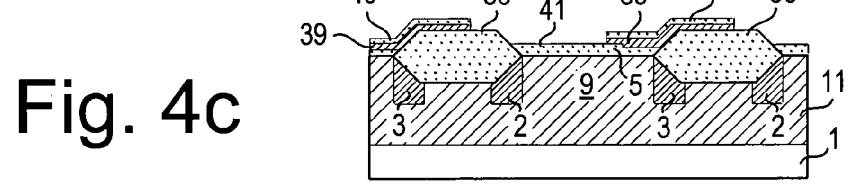
Figure 4D:
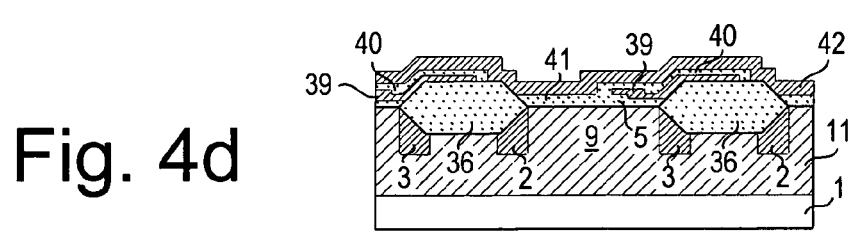
Figure 4E:
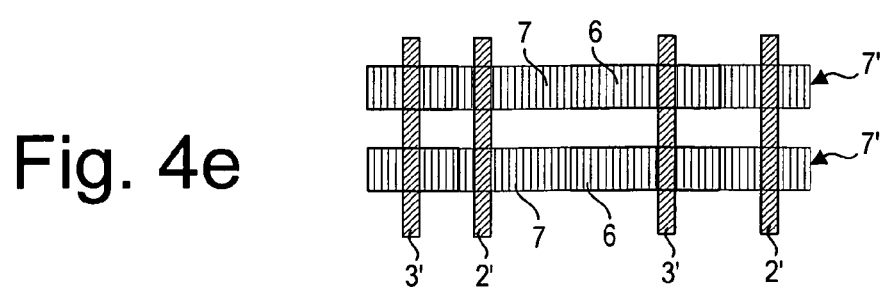

A first polysilicon layer 39 is then deposited over the top surface of the wafer so as to cover (and contact) the tunnel oxide 5. A dielectric layer 40 of oxide, nitride, and oxide layers is formed on top of the first polysilicon layer 39 (FIG. 4c). Then, using standard photolithography, the oxide/nitride/oxide (ONO) layer 40 and the first polysilicon layer 39 are etched into stripes that are parallel to the drain and source region lines 2', 3'. Each of the stripes of first polysilicon layer 39 overlie a subportion-only of a top surface of the field oxide 36, a source-side bird's beak region of the field oxide 36, the source region 3, and a source-side subportion-only of the P-well 11 top surface over channel region 9. A side of the polysilicon layer 39 terminates over channel region 9. Accordingly, drain region 2 and a drain-side subportion-only of the P-well 11 top surface over channel region 9 are not covered by the patterned first polysilicon layer 39.

Using ONO layer 40 as a mask, a fresh layer of oxide 41 is grown as the gate oxide for the select transistor portion of memory cell M1. The oxide layer 41 is disposed on the P-well 11 surface over the portion of channel region 9 uncovered by patterned first polysilicon layer 39. Oxide layer 41 separates the first polysilicon layer 39 from the drain region 2. Oxide layer 41 has an appropriate thickness, e.g., in the range of 250–400 Å, to sustain a gate voltage of ±12 to ±20V.

Then, a second polysilicon layer 42 is deposited (FIG. 4d) over ONO layer 40 and oxide layer 41. The second polysilicon layer 42 is then etched through a photoresist mask into parallel stripes, i.e., wordlines 7', that each extend perpendicularly to the drain and source region lines 2', 3' (FIGS. 2, 3) and to the stripes of first polysilicon layer 39. Each wordline 7' integrally overlies every memory cell of a row of memory cells, as well as the field oxide line 36 between adjacent memory cells. Then, in the same etch chamber and without removing the photoresist mask, the stripes of first polysilicon layer 39 are then etched through using the polysilicon layer 42 stripes as a mask. This forms isolated rectangles of the first polysilicon layer 39 at each memory cell, thereby forming floating gates 6 (FIG. 4e) under the wordlines 7'. As mentioned above, a subportion of the wordline 7' over each memory cell M1 of the row serves as the control gate 7 of the memory cell transistor. ONO layer 40 separates the control gate 7 from the floating gate 6, and oxide layer 41 separates the control gate 7 from channel region 9 and drain region 2. Other process steps to obtain standard CMOS devices and to provide contacts and interconnections for these devices are well known in the industry and will not be detailed here.

In the second implementation, the processing starts with a P-type silicon substrate 1 (FIG. 5a), into which a P-well 11 is implanted and diffused. A dielectric layer 46 is then deposited as a mask for the STI process. The active mask is realized by etching parallel STI trenches 45 in the top surface of P-well layer 11. Each STI trench 45 has two vertical sidewalls that extending from one end of the trench to the other. The columns of memory cells are formed between a pair of the STI trenches 45. In particular, an N+ dopant is implanted in the facing sidewalls of two adjacent STI trenches 45. The N+ doping is done by angle implants, and in a manner that provides a line of the N+ dopant in the two sidewalls that extends from one end of the trench to the other. The source of the dopant ions is at an acute or oblique angle to the substrate during the implanting. The implants may be annealed during subsequent process steps. As a result, the drain region 2 of each nascent memory cell M1 a column of the memory cells is at and inward of a vertical sidewall 45 of one of the STI trenches 45, and the source region 3 of the same nascent memory cell M1 is at and inward of a facing vertical sidewall of the next STI trench 45, with the channel region 9 of P-well 11 between them.

After the implanting step, the STI trenches 45 are filled with a dielectric 47, which may be an oxide. The STI dielectric 47 may be formed by depositing a blanket plasma oxide layer, and then polishing the plasma oxide layer to remove portions over and outward of the STI trench 45. The STI dielectric 47 isolates the source regions 3 of memory cells of one column of the memory from the drain regions 2 of the memory cells of an adjacent column.

Figure 5D:
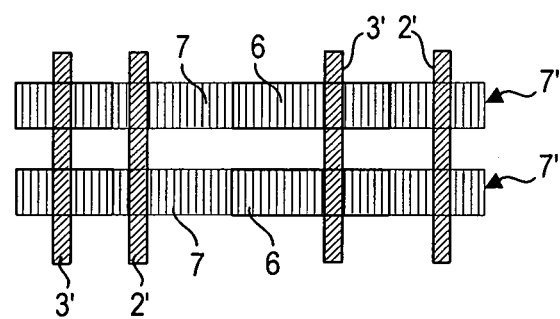

Subsequently, at each memory cell, a tunnel oxide layer 5 is grown over the source region 3 and a source-side subportion-only of the channel region 9, as mentioned above. A first polysilicon layer 39 is then deposited over the top surface of the wafer so as to cover (and contact) the tunnel oxide layer 5 at each memory cell. An ONO layer 40 is formed on top of the first polysilicon layer 39 (FIG. 4c). Then, using standard photolithography, the ONO layer 40 and the first polysilicon layer 39 are etched into stripes that are parallel to the drain and source region lines 2', 3' (FIGS. 2, 3, 5d). The stripes of first polysilicon layer 39 overlie a top, source-side subportion-only of the STI dielectric 47, the source region 3, and a source-side subportion-only of the P-well 11 surface over channel region 9. A sidewall of first polysilicon layer 39 terminates over channel region 9, so that the drain region 2 and a drain-side subportion-only of the P-well 11 top surface over the channel region 9 of the respective memory cell are not covered by the stripe of the first polysilicon layer 39.

Using the ONO layer 40 as a mask, a fresh layer of oxide 41 is on the P-well 11 top surface over channel region 9 and drain region 2, thereby forming a gate oxide for the select transistor portion of the memory cell. The oxide layer 41 separates first polysilicon layer 39 from drain region 2 and channel region 9. Oxide layer 41 has a thickness, e.g., in the range of 250–400 Å, sufficient to sustain a gate voltage of up to ±20V.

Then, a second polysilicon layer 42 is deposited (FIG. 5c) over the wafer top surface. The second polysilicon layer 42 is etched through a photoresist mask into parallel wordline 7' stripes that each extend perpendicularly to the drain and source region lines 2', 3' (FIGS. 2, 3) and the stripes of first polysilicon layer 39. Each wordline 7' integrally overlies every memory cell of a row of the memory cells, as well as the STI dielectric 47 that is between adjacent memory cells of the row. Then, in the same etch chamber and without removing the photoresist mask, the stripes of first polysilicon layer 39 are etched through using the second polysilicon layer 42 stripes as a mask. This step forms isolated rectangles of the first polysilicon layer 39, thereby forming a floating gate 6 (FIG. 5d) under the wordlines 7' at each memory cell. As mentioned above, the subportion of the wordline stripe 7' over the particular memory cell M1 serves as the control gate 7 of the memory cell transistor. ONO layer 40 separates the control gate 7 from the floating gate 6, and oxide layer 41 separates the control gate 7 from channel region 9 and drain region 2. Other process steps to obtain standard CMOS devices and to provide contacts and interconnections for these devices are well known in the industry and will not be detailed here.

Figure 8:
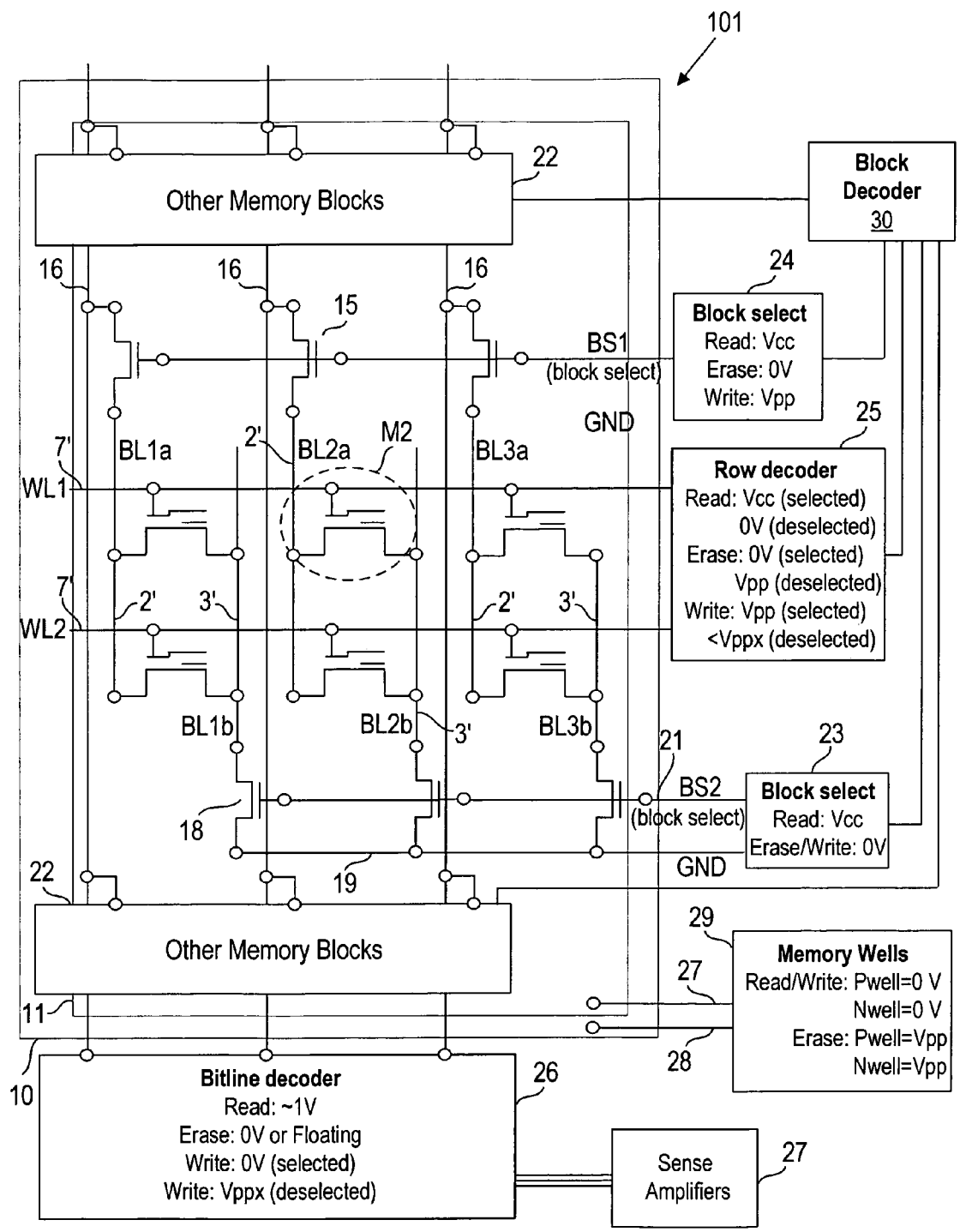
FIG. 8 is a schematic diagram of a non-volatile memory array showing an interconnection of plural blocks of the memory cells of FIGS. 6 and 7, and parameter values for operation of the memory array.
Figure 9A:
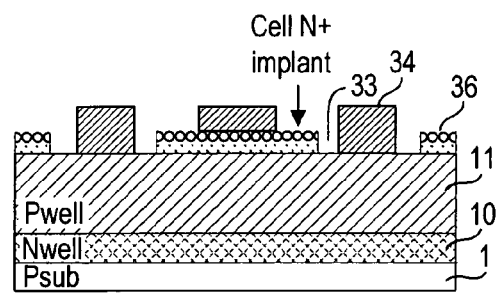
FIGS. 9a–9e are cross-sectional side views of stages in a first process for making memory cells, in accordance with the present invention.
Figure 9B:
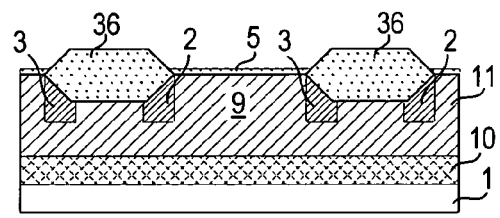
Figure 9C:
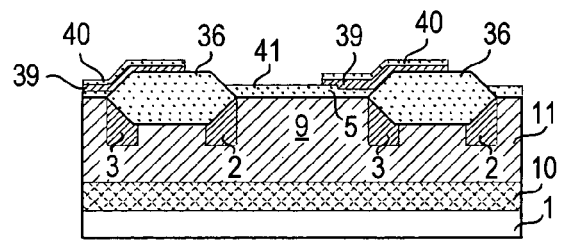
Figure 9D:
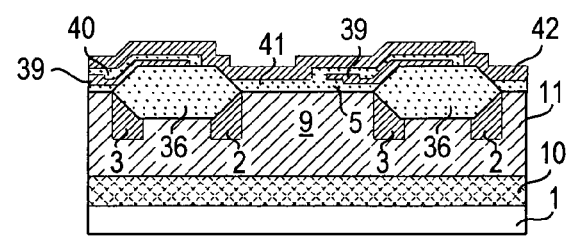
Figure 9E:
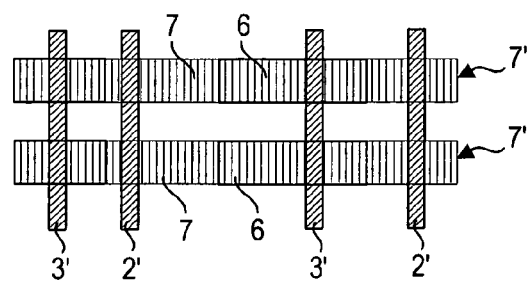
Figure 10A:
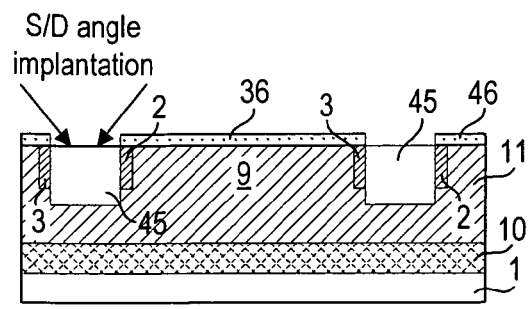
FIGS. 10a–10d are cross-sectional side views of stages in a second process for making memory cells, in accordance with the present invention.
Figure 10B:
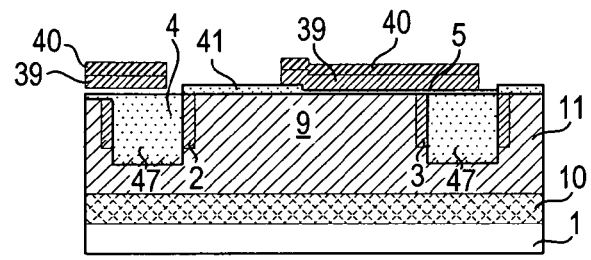
Figure 10C:
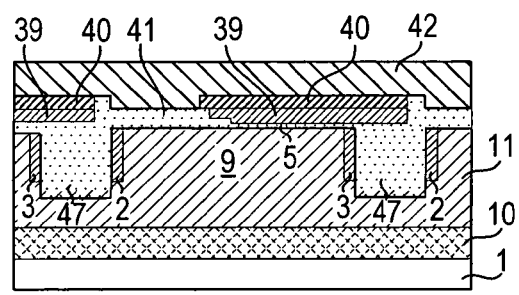
Figure 10D:
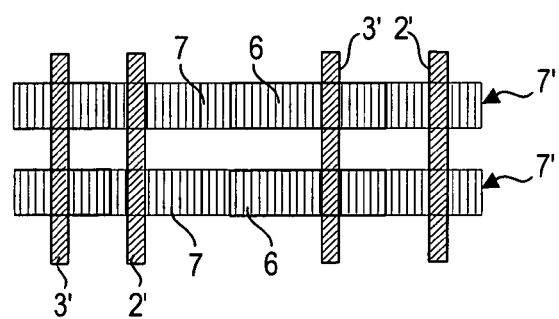

A second embodiment of a non-volatile memory, denoted as non-volatile memory 101, and exemplary methods of making it, are disclosed in FIGS. 6–8. A main building block of the non-volatile memory 101 is a memory cell M2.

Nonvolatile memory 101 and memory cells M2 of FIGS. 6 and 7 are basically identical to memory 100 and memory cell M1 of FIGS. 1–3, except that the P-well 11, in which the memory cells M2 are formed, is itself formed in an N-well 10. N-well 10 is deeply diffused into P-type semiconductor substrate 1. Both P-well 11 and N-well 10 are coupled to voltage sources. Further discussion of the structural aspects of FIGS. 6 and 7 is not necessary, since those figures otherwise include the same structures and the same reference numbers as FIGS. 1 and 2. The reader should consult the discussion above, which is incorporated herein by reference.

The basic operation of the portion of memory 101 shown in FIG. 7 is provided in Table 2 (FIG. 7a) as an illustration of the operation of the larger memory array 101 comprised of any number (e.g., a plurality) of columns and rows of memory cells M2. The parameter values for memory array 101, as set forth in Table 2 (FIG. 7a), differ from those for memory array 100 (Table 1, FIG. 2) due to the disposition of P-well 11 in N-well 10.

Referring to FIG. 7 and Table 2, an erase operation erases all of the memory cells of a particular row or rows. During the erase, the wordline 7' (denoted WL1) overlying the selected row, which includes the circled memory cell M2, is biased to ground (0 V), while the underlying P-well 11 and N-well 10 are biased to a positive high voltage, Vpp, for a time on the order of a few milliseconds. The deselected wordlines 7' (denoted WL2) overlying the deselected rows of memory cells also are biased to Vpp, the same bias that is applied to wells 10, 11. At the same time, all of the drain region lines 2' and source region lines 3' are kept floating. The floating gates 6 of the memory cells of the selected row are biased, by capacitive coupling, to voltages much smaller than the voltage of the underlying P-well 11, such that electrons pass from the respective floating gates 6 through the underlying tunnel oxide layer 5 into the P-well 11 by Fowler-Nordheim tunneling. Accordingly, the floating gates 6 of all of the memory cells of the selected row (WL1) become positively charged. The erased state corresponds to the conductive state of the memory cell. The Vpp voltage can be in the range 12V to 20V depending on tunnel oxide thickness, floating gate coupling and other cell construction details.

Practitioners will appreciate that one or more rows of the memory cells of memory array 101 can be erased, depending on how many wordlines 7' are coupled to ground.

During a write operation for the selected (i.e., circled) memory cell M2 of FIG. 7, the overlying wordline 7' (WL1), which includes the control gate 7 for each of the cells of the row, is biased at a positive high voltage, Vpp. Meanwhile, the drain region line 2' of the selected memory cell M2 (and for the other memory cells of the same column) is set to ground (0 V). The wells 10 and 11 also are set to ground (0 V). The source region lines 3' (BL1b, BL2b, BL3b) are allowed to float. By capacitive coupling, the floating gate 6 of the selected memory cell M2 is biased to a positive voltage such that electrons pass from the channel region 9 through the tunnel oxide layer 5 to the floating gate 6 by Fowler-Nordheim tunneling. Alternatively, N-well 10 may be coupled to a positive voltage (>0 V) to prevent possible latch up.

Note that, during the write operation, the source region line 3' is floating and will take the same potential as the drain region line 2' because the selected memory cell transistor is turned on during programming (the gate voltage is very high). The absence of a voltage bias between the drain and source regions during programming helps to avoid junction breakdown and to avoid the emission of hot carriers. Hot carriers especially are well known to cause oxide and interface deterioration in non-volatile memories Accordingly, during the write operation, the floating gate 6 of the selected memory cell M2 develops a net negative charge. This state, called the programmed state, corresponds to the non-conductive state (logical zero) of the selected memory cell M2. The positive Vpp voltage can be in the range 12V to 20V, similarly as in the erase phase.

During the write operation, deselection of the memory cells in the same row as the selected memory cell M2 is accomplished by counter biasing the drain region lines 2' (BL1a, BL3a of FIG. 7) of the deselected columns of memory cells to a lower positive voltage, Vppx. The value of Vppx may be in the range of 3V to 7V, and generally depends on the desired window between the erased and programmed state. Typically, Vppx is less than or equal to half of Vpp. The source region lines 3' (BL2b, BL3b) for the deselected columns of memory cells are floating. The application of Vpp to the selected wordline 7', together with the application of Vppx on the drain region lines 2' of the deselected columns, will bias the respective tunnel oxide regions to a voltage equal or less than the difference between Vpp and Vppx, which bias is too small to cause any significant Fowler-Nordheim programming. Accordingly, the floating gates 6 of the deselected memory cells in the selected row will not be affected.

During the write operation, there is a disturb path for the cells on the deselected rows (WL2) of memory, because of the source region lines 3' that are biased to Vppx. Recall that the source region lines 3' float, and take the same potential (Vppx) as their counterpart drain region line 2'. This disturb risk can be completely avoided by biasing the wordlines 7' (WL2) overlying the deselected rows of memory cells to a voltage equal to or less than Vppx. The application of a voltage <Vppx on deselected wordline will bias the respective tunnel oxide regions 5 to a voltage too small to cause any significant change in the floating gate charge.

During the read phase, all of source region lines 3' (BL1b, BL2b, BL3b) and the wells 10, 11 of FIG. 7 are connected to ground (0 V). Meanwhile, all of the drain region lines 2' (BL1a, BL2a, BL3a) are biased to a low positive voltage Vr, which may be ~1V. The selected wordline 7' for the selected memory cell M2 is biased to a low voltage, in the range of the supply voltage Vcc. The deselected wordlines 7' (WL2) are coupled to ground (0 V) in order to block the current to the memory cells of the deselected rows. According, if memory cell M2 is in an erased state (i.e., logical one, with a net positive charge on floating gate 6, then the application of Vcc to the selected wordline 7'. A sense amplifier (not shown) detects whether the selected memory cell M2 turns on in response to the application of Vcc to the wordline 7' (i.e., the control gate 7) of the selected memory cell. On the other hand, if memory cell M2 is in a programmed state (i.e., logical zero), with a net negative charge on floating gate 6, then the application of Vcc to the selected wordline 7', i.e., to the control gate 7, of the selected memory cell M2 will not turn on the transistor, i.e., the transistor is not conductive.

FIG. 8 shows an architecture of a non-volatile memory 101, in accordance with one embodiment of the present invention. Parameters for the erase, write, and read phases also are shown in FIG. 8. The architecture of memory 101 of FIG. 8 is very similar to the architecture of memory 100 of FIG. 3, and bears similar reference numbers. Hence, the reader is referred to the discussion of FIG. 3, which is incorporated herein by reference. Accordingly, the following discussion of memory 101 that follows can be abbreviated by focusing on the differences between memory 101 and memory 100.

Referring to FIG. 8, memory 101 is organized in blocks 22. Each block 22 consists of a selected number of rows and columns of memory cells M2. The number of rows of memory cells (i.e., the number of wordlines 7') is normally a power of 2 (16, 32, 64, etc). All of the blocks 22 are formed in a single P-well 11, which itself is formed in a single N-well 10 of P-substrate 1 (FIG. 6). A well bias circuit 29 is coupled to the P-well 10 and N-well 11 by connections 28, 27, respectively. Well bias circuit 29 provides a plurality of bias voltages to P-well 10 and N-well 11. The bias differs for the various operations of the memory. Alternatively, a plurality of separate P-wells 11 may be provided in one N-well 10, with each P-well 11 including one or more blocks 22, or each block 22 may be provided in a separate P-well 11 and N-well 10.

With the exception of building P-well 11 in N-well 10, and providing a controllable well bias circuit 29 to bias wells 10 and 11, the structure of memory 101 of FIG. 8 is the same as that of memory 101 of FIG. 3. Hence, the above discussion of FIG. 3 is incorporated herein by reference.

The operation of memory 101 of FIG. 8 is very similar to the operation of memory 100 of FIG. 3 (compare FIGS. 2, 2a, and 3 to 7, 7a, and 8, respectively). The difference in operation of memory 101 versus memory 100 stems from the fact that memory 101 is built in a P-well 11 and N-well 10 of P-substrate 1, and has bias circuitry for P-well 11 and N-well 10.

During an erase operation, well bias circuitry 29 of FIG. 8 provides a positive voltage Vpp to both N-well 10 and P-well 11 via connections 28 and 27, respectively. Biasing N-well 10 and P-well 11 to Vpp during the erase operation, while the selected wordline 7' is grounded, causes electrons to pass from the floating gate 6 of the selected memory cell M2 to the P-well 11. The floating gates 6 of the deselected rows are not affected, because the deselected wordlines also are biased to Vpp.

During read and write operations, well bias circuitry 29 of FIG. 8 biases N-well 10 and P-well 11 to ground (0 V) via connections 28 and 27, respectively. Alternately, N-well 10 can be biased to a slightly positive voltage, to prevent accidental junction turn-on.

Other than the biasing of the wells 10 and 11, and the different voltages applied to the wordlines 7' during the write operation, memory 101 operates with the same parameters in the erase, write, and read operations as memory 100 of FIG. 3, which is discussed above. Hence, further discussion is not required.

Exemplary processes for making the memory cells M2 of the non-volatile memory 101 of FIGS. 6, 7, and 8 are provided in FIGS. 9a–9e and 10a–10e. The processes of FIGS. 9a–9e, and 10a–10d are essentially identical to the processes of FIGS. 4a–4e and 5a–5d, respectively. The difference between the embodiments is related to the semiconductor substrate 1. In particular, in the embodiments of FIGS. 9a–9e and 10a–10d, the processing starts with a P-type silicon wafer 1 (FIG. 9a), into which an N-type dopant is implanted and deeply diffused, forming the N-well 10. Next, a P-type dopant is implanted and deeply diffused in the N-well 10, forming P-well 11. Since the processes of FIGS. 9a–9e and 10a–10d are otherwise identical to the processes of FIGS. 4a–4e and 5a–5d, respectively, it is not necessary to describe the processes of FIGS. 9a–9e and 10a–10d any further. The reader should refer to the prior discussion of FIGS. 4a–4e and 5a–5d, which is incorporated here by reference.

The invention is not limited to the exemplary embodiments described above. Other embodiments may be suggested to practitioners by the disclosure herein. For instance, while some structures are identified herein as having a P-type conductivity, and other materials are identified as having an N-type conductivity, the conductivity types can be switched. Such a switch could change the polarity of the voltages that would need to be applied in the read, write, and/or erase phases, but in a predictable manner.

What is claimed is:

1. A semiconductor device including a plurality of non-volatile memory cells arrayed in rows and columns, the semiconductor device comprising:

(a) a semiconductor substrate comprising a first region of a first conductivity type;
    (b) a plurality of parallel pairs of parallel implant region lines of a second conductivity type in the first region, wherein each of the columns of the non-volatile memory cells overlaps a respective one of the pairs of the implant regions lines, respective subportions of one of the implant region lines of the pair comprise respective source regions for the respective memory cells of the respective column, respective subportions of the other implant region line of the pair comprise respective drain regions for the respective memory cells of the column, and respective subportions of the first region between the respective source and drain regions of the respective memory cells comprises respective channel regions of the respective memory cells of the column;
    (c) one or more dielectric region lines in the first region and parallel to the implant region lines, wherein at least one of the dielectric region lines is between adjacent said pairs of the implant region lines;
    (d) a tunnel dielectric layer formed in a vicinity of the source region of each of the non-volatile memory cells, wherein the tunnel dielectric layer is in contact with the respective source region;
    (e) a plurality of regions of a first polysilicon layer, wherein each said non-volatile memory cell has one of the first polysilicon layer regions over the source region and over and in contact with the tunnel dielectric layer, the first polysilicon region being a floating gate that terminates over the channel region without extending to the drain region of the memory cell;
    (f) a plurality of lines of a second polysilicon layer each extending perpendicularly to the implant region lines, wherein each said second polysilicon layer line integrally overlies all of the memory cells of a row and the dielectric region line between adjacent memory cells of the row, and a respective subportion of the second polysilicon layer line is a control gate of each said memory cell of the row; and
    (g) at each of the non-volatile memory cells, a dielectric layer separating the second polysilicon layer line from the region of, first region surface over the channel region, and the drain region.

2. The semiconductor device of claim 1, wherein the first region is formed in a second region of the semiconductor substrate, the second region is of the second conductivity type, and the semiconductor substrate is of the first conductivity type.

3. The semiconductor device of claim 1, wherein the regions of the first polysilicon layer each have a rectangular shape.

4. The semiconductor device of claim 1, wherein the dielectric region lines comprise a field oxide.

5. The semiconductor device of claim 1, wherein the dielectric region lines each comprise an oxide layer formed in a trench in the first region.

6. The semiconductor device of claim 1, wherein the semiconductor substrate is of the first conductivity type, and the first region is deeply diffused in the semiconductor substrate.

7. The semiconductor device of claim 1, further comprising a plurality of main bitlines coupled to a bitline decoder, and a plurality of pass transistors, wherein each said implant region line that includes the drain regions is coupled at an end thereof to a respective one of said main bitlines through one of the pass transistors.

8. The semiconductor device of claim 1, further comprising a plurality of pass transistors, wherein each said implant region line that comprises the source regions is coupled at an end thereof to a reference voltage source through a respective one of the pass transistors.

9. The semiconductor device of claim 8, further comprising at least one sense amplifier coupled to the bitline decoder.

10. The semiconductor device of claim 1, further comprising a plurality of first and second pass transistors, wherein one of the first pass transistors is coupled to a respective one of the implant region lines of each pair of implant region lines, one of the second pass transistors is coupled to the other one of the implant region lines of the pair of implant region lines, the first pass transistors have a common control line for operating the first pass transistors, and the second pass transistors have a common control line for operating the second pass transistors.

* * * * *